United States Patent
Tashiro et al.

(10) Patent No.: US 7,842,927 B2
(45) Date of Patent: *Nov. 30, 2010

(54) IMAGE SENSOR, IMAGE-SENSING APPARATUS USING THE IMAGE SENSOR, AND IMAGE-SENSING SYSTEM

(75) Inventors: Kazuaki Tashiro, Hadano (JP); Noriyuki Kaifu, Tokyo (JP); Shin Kikuchi, Isehara (JP); Tomoyuki Noda, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/473,535

(22) Filed: May 28, 2009

(65) Prior Publication Data

US 2009/0230290 A1 Sep. 17, 2009

Related U.S. Application Data

(63) Continuation of application No. 11/100,889, filed on Apr. 6, 2005, now Pat. No. 7,564,037, which is a continuation of application No. 10/231,243, filed on Aug. 29, 2002, now Pat. No. 6,906,332.

(30) Foreign Application Priority Data

Aug. 30, 2001 (JP) ............................. 2001-261740

(51) Int. Cl.
    *G01T 1/20* (2006.01)

(52) U.S. Cl. ................................. 250/370.11

(58) Field of Classification Search ............. 250/370.11
See application file for complete search history.

(56) References Cited

U.S. PATENT DOCUMENTS

| 5,159,455 A | 10/1992 | Cox et al. ............... 358/213.11 |
| 5,315,101 A | 5/1994 | Hughes et al. ........... 250/208.1 |
| 5,436,458 A | 7/1995 | Tran et al. ............... 250/370.09 |
| 6,246,042 B1 | 6/2001 | Szydlowski .............. 250/206.1 |
| 6,552,323 B2 | 4/2003 | Guidash et al. .......... 250/208.1 |
| 6,906,332 B2 | 6/2005 | Tashiro et al. .......... 250/370.11 |
| 7,564,037 B2 * | 7/2009 | Tashiro et al. .......... 250/370.11 |
| 2009/0230312 A1 * | 9/2009 | Tashiro et al. .......... 250/370.11 |

FOREIGN PATENT DOCUMENTS

WO WO 99/31874 6/1999

* cited by examiner

*Primary Examiner*—Constantine Hannaher
(74) *Attorney, Agent, or Firm*—Fitzpatrick, Cella, Harper & Scinto

(57) ABSTRACT

An image sensor has a plurality of pixels, each pixel including a photoelectric converter and a pixel circuit for processing signals from the photoelectric converter and outputting processed signals and a scanning circuit, disposed between the photoelectric converters, included in each of at least two adjacent pixels among a plurality of pixels aligned in a single direction. An edge pixel accommodates, in order from an edge of the image sensor toward an interior, a predetermined empty region, a photoelectric converter and a pixel circuit. There is at least one position at which two adjacent pixels, the first of the two pixels accommodating, in order, a pixel circuit, a photoelectric converter and predetermined empty region, the second accommodating, in order, a predetermined empty region, a photoelectric converter and a pixel circuit. The scanning circuit is disposed in the predetermined empty region between the two adjacent pixels.

15 Claims, 13 Drawing Sheets

PRIOR ART

IMAGE SENSOR, IMAGE-SENSING APPARATUS USING THE IMAGE SENSOR, AND IMAGE-SENSING SYSTEM

RELATED APPLICATIONS

This application is a continuation of application Ser. No. 11/100,889, filed Apr. 6, 2005, which is a continuation of application Ser. No. 10/231,243, filed Aug. 29, 2002, now U.S. Pat. No. 6,906,332. This application claims benefit of both applications under 35 U.S.C. §120, claims benefit under 35 U.S.C. §119 of Japanese patent application no. 2001/261740, filed Aug. 30, 2001, and incorporates by reference the entire disclosure of each of the three mentioned prior applications.

FIELD OF THE INVENTION

The present invention relates to an image sensor for sensing an image, an image-sensing apparatus using the image sensor, and an image-sensing system using the image-sensing apparatus.

BACKGROUND OF THE INVENTION

Advances in digital technology have found increasingly wide application in the field of medicine in general and radiology in particular. A two-dimensional radiographic apparatus for radiological use has been developed in order to digitalize X-ray images, in which a scintillator is used to convert the X-rays into visible light that is then sensed and formed into a diagnostic image by image sensors.

As two-dimensional radiographic apparatuses, compact CCD image sensors for use in dentistry have already been commercialized, and for mammography and thoracic X-ray use a large-scale, still-image sensing apparatus using maximum 43 cm-square panels of amorphous silicon has been produced. Image sensors that use amorphous silicon semiconductors formed on a glass substrate can be formed easily into large panels, and large-scale radiographic apparatuses have been achieved using four tiles of such panels. An example of this type of technology is described in U.S. Pat. No. 5,315,101.

Similarly, a large-panel radiographic apparatus comprising a plurality of monocrystalline image sensors (such as silicon image sensors) has been proposed. An example of this type of technology is U.S. Pat. No. 5,159,455, shown in FIG. 12. Silicon-based CCD-type image sensors and MOS- or CMOS-type image sensors may be used for the monocrystalline image sensors.

Further advances in the digitalization of medical radiographic diagnostics are expected, in the form of still more sensitive still-image sensing apparatuses and next-generation, moving-image sensing apparatuses.

In this case, acquiring a moving image necessitates directing a continuous X-ray onto a human subject. The known adverse effects on living tissue of prolonged exposure to X-ray radiation, however, make it desirable to reduce the intensity of X-ray to, e.g., {fraction (1/100)} of normal intensity and to employ read speeds of 60-90 frames/sec, which in turn requires apparatuses that are several tens of times faster and more sensitive than ordinary still-image acquisition equipment.

The process of manufacturing an amorphous silicon panel image-sensing apparatus possesses the advantage of yielding larger panels compared to the process for manufacturing CCD image sensors and CMOS image sensors, but with the disadvantage that it is more difficult to carry out fine processing of a semiconductor on a glass substrate than on a monocrystalline silicon semiconductor substrate, and as a result the output signal line capacitance increases. This capacitance is the largest source of noise (kTC noise) and limits improvements in sensitivity. Moreover, with amorphous silicon the semiconductor characteristics are not enough to increase the speed of operation, so that acquisition of moving images at speeds of 30 frames/sec or more is difficult.

CCD image sensors, though of the complete-depletion type and therefore sensitive, are unsuited as wide-area image-sensing elements. A CCD image sensor is a charge transfer device, so as the area (i.e., the number of pixels) increases and the number of transfer steps grows large, transfer becomes a problem. In other words, the drive voltage is different at the drive terminal and near the center, making complete transfer difficult. In addition, power consumption, which may be expressed as $CVf^2$ (where C is the capacitance across the substrate and the well, V is the pulse amplitude, and f is the pulse frequency) experiences a ten-fold increase compared to that of a CMOS image sensor because C and V increase as the area increases. As a result, the drive circuitry in this area generates heat and noise, degrading the S/N ratio. For these reasons a CCD-type image sensor is not suitable as a large-scale image sensor.

In a simple large-panel image-sensing apparatus using a multiplicity of monocrystalline image sensors, dead space is inevitably created wherever the image sensors adjoin (necessitated by the need for a region separate from the pixel region for providing peripheral circuitry such as a shift register, multiplexer and amplifier, external terminals for transmitting signals and power to and from an external device and a protective circuit composed of a protective diode or a protective resistance against static electricity). This dead-space portion leads to line defects (that is, gaps in the image) and a deterioration in picture quality. For this reason a tapered FOP (fiber optic plate) is used to direct light from a scintillator around the dead spaces and toward the image sensor pixel region. However, such a configuration requires a very expensive tapered FOP, which increases production costs. Moreover, a tapered FOP has a disadvantage in that the sharper the angle of taper the harder it is for light from the scintillator to enter the tapered FOP, which leads to a decrease in output light level that can offset the sensitivity of the image sensors and reduce the overall sensitivity of the apparatus.

SUMMARY OF THE INVENTION

Accordingly, the present invention has been made in consideration of the above-described situation, and has as its object to prevent deterioration in picture quality due to line gaps in the picture image arising from dead space at the edges where adjacent panels meet in a configuration in which a plurality of image sensor panels are joined together to create a large image sensor, and to prevent deterioration in picture quality due to slight deviations in pitch between respective photo-receptor portions.

According to the present invention, the above-described object is attained by an image sensor having a plurality of pixels, each pixel including a photoelectric converter and a pixel circuit for processing signals from the photoelectric converter and outputting processed signals to an output line, and a scanning circuit, disposed between the photoelectric converters, included in each of at least two adjacent pixels among a plurality of pixels aligned in a single direction. An edge pixel of the plurality of pixels accommodates, in order from an edge of the image sensor toward an interior of the image sensor, a predetermined empty region, a photoelectric converter and a pixel circuit. The plurality of pixels have at least one position at which two pixels are disposed adjacent to each other, a first of the two pixels accommodating, in order, a pixel circuit, a photoelectric converter and predetermined empty region, a second of the two pixels accommodating, in order, a predetermined empty region, a photoelectric converter and a pixel circuit. The scanning circuit is disposed in the predetermined empty region between the two adjacent pixels.

In addition, according to the present invention, the above-described object is also attained by an image-sensing apparatus comprising a plurality of the image sensors described above.

In addition, according to the present invention, the above-described object is also attained by an image-sensing system that includes the image-sensing apparatus described above, a signal processing circuit adapted to process signals from the image-sensing apparatus, a recording circuit adapted to record the signal processed by the signal processing circuit, and a display circuit for displaying the signal processed by the signal processing circuit.

In addition, according to the present invention, the above-described object is also attained by an image sensor having a plurality of pixels, each pixel including a photoelectric converter and a pixel circuit for processing signals from the photoelectric converter and outputting processed signals to an output line, and a processing circuit adapted to process signals from the plurality of pixels, disposed between the photoelectric converters, included in each of at least two adjacent pixels among a plurality of pixels aligned in a single direction. An edge pixel of the plurality of pixels accommodates, in order from an edge of the image sensor toward an interior of the image sensor, a predetermined empty region, a photoelectric converter and a pixel circuit. The plurality of pixels have at least one position at which two pixels are disposed adjacent to each other, a first of the two pixels accommodating, in order, a pixel circuit, a photoelectric converter and a predetermined empty region, a second of the two pixels accommodating, in order, a predetermined empty region, a photoelectric converter and a pixel circuit. The processing circuit is disposed in the predetermined empty region between the two pixels disposed adjacent to each other.

In addition, according to the present invention, the above-described object is also attained by an image-sensing apparatus having a plurality of the image sensors described above.

In addition, according to the present invention, the above-described object is also attained by an image-sensing system that includes the image-sensing apparatus described above, a signal processing circuit adapted to process signals from the image-sensing apparatus, a recording circuit adapted to record the signal processed by the signal processing circuit, and a display circuit for displaying the signal processed by the signal processing circuit.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

First Embodiment

Figure 1:
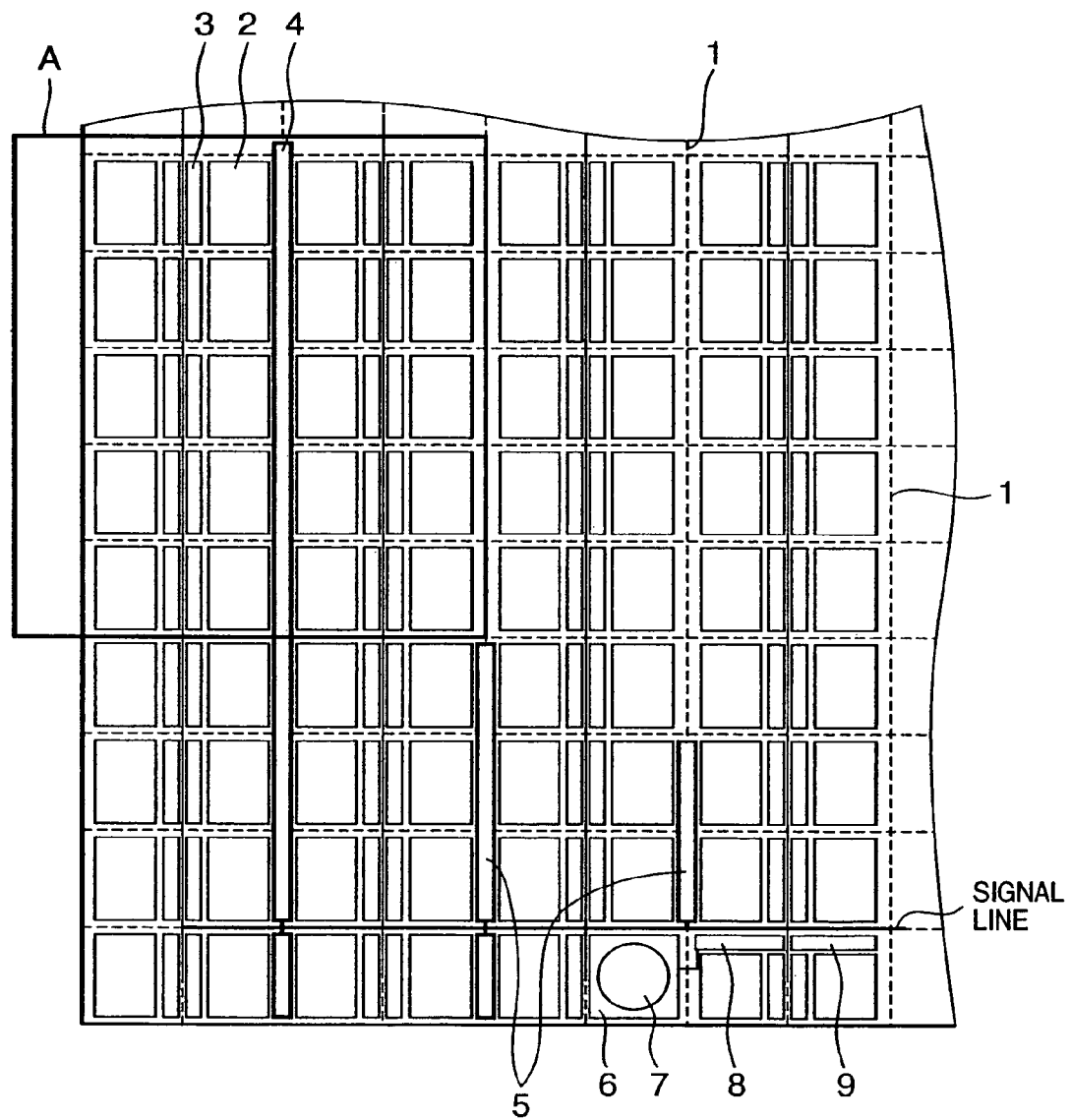
FIG. 1 is a diagram showing the arrangement of the parts that comprise the pixels of the image sensor of the image-sensing apparatus according to a first embodiment of the present invention.

FIG. 1 is a plan view of a CMOS-type image sensor according to a first embodiment of the present invention.

In the first embodiment, as will be described later, nine image sensor tiles are arranged to form a large-panel image-sensing apparatus. In a diagnostic radiographic apparatus, the size of the pixels can be relatively large, that is, squares of approximately 100 μm to 200 μm a side. In the present first embodiment, the size of the pixel is approximately 160 μm a side.

Figure 2:
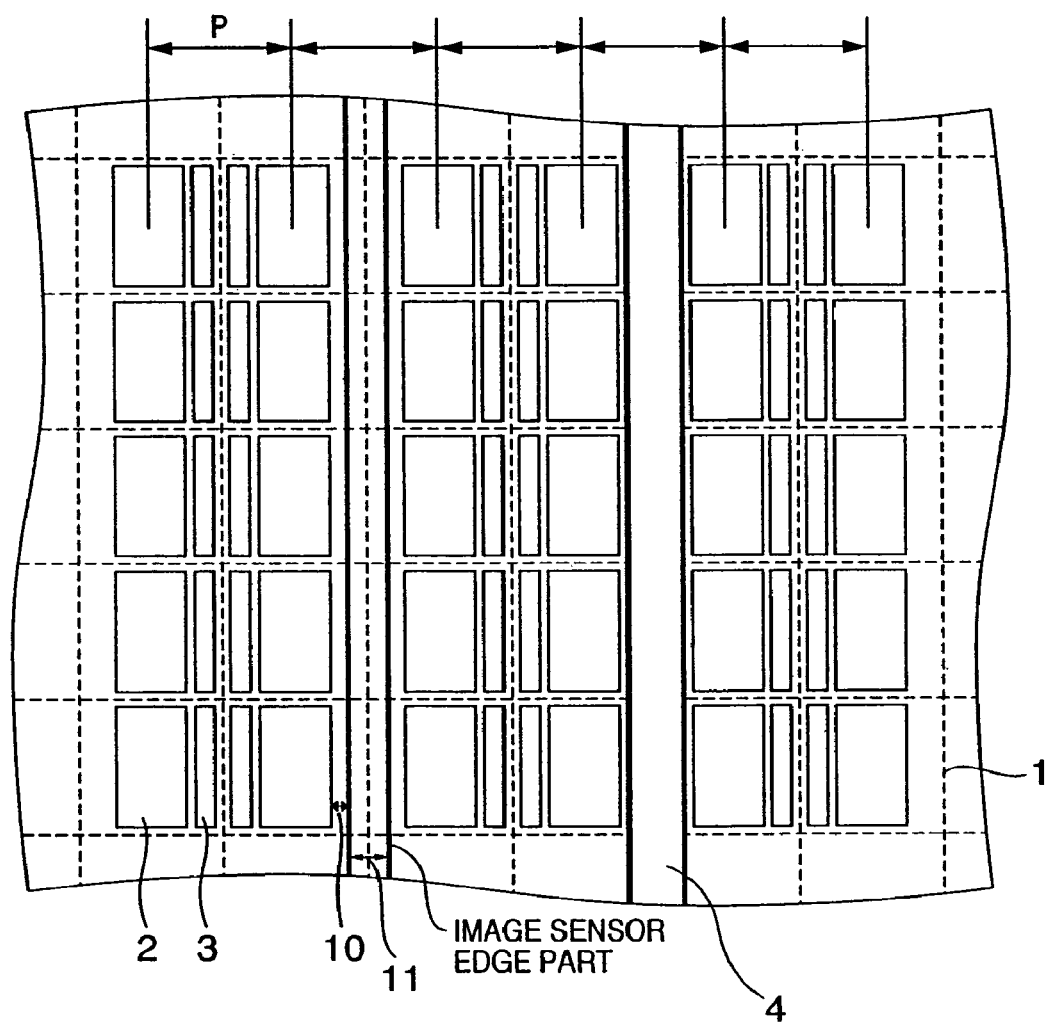
FIG. 2 is a diagram showing an expanded view of part A of FIG. 1.

FIG. 2 is a diagram showing an expanded view of part A of FIG. 1. In FIG. 2, the relation between adjacent image sensors is also shown.

In both FIG. 1 and FIG. 2, reference numeral 1 denotes the boundary line between pixels, reference numeral 2 denotes a photoelectric converter (that is, a photodiode), reference numeral 3 denotes a pixel circuit (including pixel-internal amplifier, pixel selection switch, reset switch and transfer switch). The photoelectric converter 2 and the pixel circuit 3 together form a single pixel, with the pixels arranged horizontally and vertically in columns and rows, that is, in two dimensions.

Reference numeral 4 denotes a vertical scan control block, which is a logic circuit, that includes a vertical shift register as a vertical scanning circuit that controls all pixels in a single horizontal line and also performs reset, pixel selection and charge transfer in order to scan vertically. Reference numeral 5 denotes a horizontal scan control block that includes a shift register as a horizontal scanning circuit for sequentially outputting signals from a horizontal line of pixels and also includes a shared processing circuit such as a serial-parallel conversion multiplexer, a buffer, gates and output amplifiers for processing output signals from a horizontal line of pixels.

Reference numeral 6 denotes a terminal for connecting to an external circuit, reference numeral 7 denotes a bump for providing an electrical connection between the terminal 6 and a flexible tape (not shown in the diagram), and reference numerals 8 and 9 denote a protective resistance and a protective diode, respectively, for protecting the circuits inside the image sensor from static electricity from external sources.

In addition, in FIG. 2, reference numeral 10 denotes a slice margin region and reference numeral 11 denotes a composite margin region (gap).

In an image-sensing apparatus that combines a plurality of image sensors, in order to obtain a full image without line gaps it is necessary to arrange the centers of gravity of the photoelectric converters 2 within and between the image sensors at the same pitch (in the present first embodiment, at the above-described distance of 160 μm). It is more preferable if the photoelectric converters 2 have the same area within and between image sensors. With such an arrangement, a full image of uniform sensitivity with no change in pitch between line gaps can still be obtained even with slice margins 10 at the edges of the image sensors and even with composite margins (gaps) 11 between image sensors. In such a case, there is no need for image processing such as the line gap interpolation that is required in order to correct for the dead space (defective or non-existent pixel region) arising at the gaps between a plurality of image sensors as in the conventional image-sensing apparatus.

As shown in FIG. 2, in the present invention according to a first embodiment, the pixels are arranged at a uniform pitch both within the image sensors and between image sensors. Moreover, the centers of gravity of the photoelectric converters of the pixels are also arranged at the same pitch horizontally and vertically. Moreover, the areas of the photoelectric converters inside all the pixels inside the image sensors are the same. In the present embodiment, this is achieved by the arrangement of the pixel circuits 3 and the photoelectric converters 2 inside the pixels, and further by the shift registers provided inside the pixel regions of the image sensors as described below.

As shown in FIG. 2, the pixels that contact the edges of the image sensors have an effective area (the region on which photoelectric converters can be arranged) that is smaller than that of other pixels due to the slice margin and the composite margin. When arranging the photoelectric converters 2 and the pixel circuits 3 inside these pixels so that the photoelectric converters 2 are arranged at the same pitch and the same area within image sensors as well as between image sensors, the pixel circuits 3 are arranged symmetrically about a hypothetical line drawn between pixels arranged along an edge of the image sensor and adjacent pixels inside the image sensor, in other words so-called mirror-image arrangement. In the present embodiment, the elements that comprise the pixel circuits 3 (that is, a pixel-internal amplifier, pixel selection switch, reset switch and transfer switch) are also arranged symmetrically.

The photoelectric converters 2 are also arranged symmetrically about a line parting the pixel circuits 3. Further, the pixel circuits 3 of the two rows of pixels adjacent to these two rows (or two lines) are also arranged symmetrically about a hypothetical line contacting the pixels.

Moreover, with such an arrangement, an empty space is formed between every two rows of photoelectric converters. The photoelectric converters 2 are also arranged symmetrically about this empty space. In this embodiment, a vertical shift register that is a vertical scan circuit is disposed in this single row of empty space where no pixel circuit 3 is provided. Further, a horizontal shift register that is a horizontal scan circuit, a multiplexer, a buffer, a shared amplifier and the like are provided as appropriate in the other empty spaces.

In the preceding paragraph, a name "horizontal" shift register is used for convenience in view of its electrical function that transfers and outputs charges of each row in the order of the pixels in the row. However, the "horizontal" shift register is arranged along a "vertical" empty space.

Figure 3:
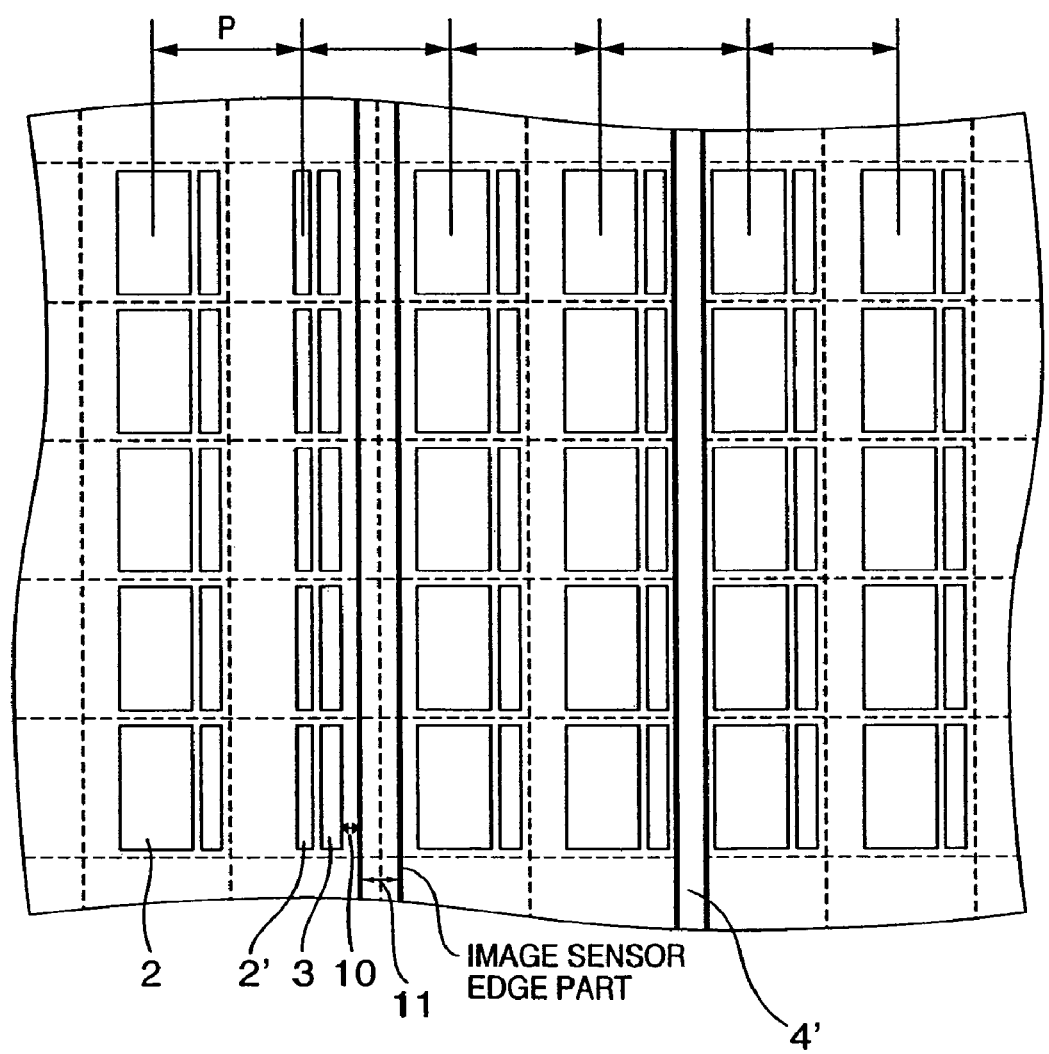
FIG. 3 is a diagram showing the arrangement of the parts that comprise the pixels not arranged symmetrically every two pixels.

Next, a description is given of the advantages of the above-described mirror-image arrangement as compared to a case in which such an arrangement is not used, by comparing FIG. 2 with FIG. 3.

FIG. 3 is a diagram showing the arrangement of the parts that comprise the pixels not arranged symmetrically every two pixels. Basically, photoelectric converters having the same area as those shown in FIG. 2 are disposed apart at a pitch of 160 μm. However, in order to make the distance between centers of photoelectric converters 2 within and between image sensors uniform, the photoelectric converters 2 and the pixel circuits 3 in the pixels at the edges, which have a smaller pixel area than other pixels due to the slice margin and composite margin, must also be disposed at the same pitch.

In such a case, as shown in FIG. 3, in order to dispose these elements at the same pitch the area of the photoelectric converters 2' at the edge pixels becomes very small and so the edge pixel sensitivity also declines substantially. In the worst case, the photoelectric converters cannot function as photo detectors at all and become essentially defective pixels, making it difficult to obtain a full image without line gaps. Moreover, since the area for providing a scanning circuit is so reduced (in this case the space width is so narrow), even if it were possible to mount a shift register with a simplified structure it would nevertheless be difficult to fit a logic circuit or a scanning circuit such as a decoder or a shift register having a complex logic for performing complex scanning of an image adder inside the pixel region. The area (in this case the width) of the photoelectric converters 2 of the pixels around the scanning circuit can be reduced and a region for the scanning circuit can be secured, but to the extent possible, it is preferable to make the pitch and the area of the photoelectric converters 2 identical in order to obtain a full image with no line gaps. Space for the scanning circuits can also be secured by reducing the area of the photoelectric converters 2 of all the pixels and securing the same pitch and area, but such an approach leads inevitably to a loss of overall sensitivity and is not preferable in terms of obtaining a sensitive image-sensing apparatus.

Here, by employing the structure of the first embodiment as shown in FIG. 2, the area of the photoelectric converters can be maximized and photoelectric converters themselves can be arranged at the same pitch, and moreover, a wide region for accommodating the scanning circuits can be secured within the pixel regions.

Similarly, by giving the pixel circuits 3 a mirror-image circuit arrangement, the power lines needed for every row of pixels in the conventional art can now be laid at every other row of pixels, thereby reducing the opportunity for manufacturing defects in the power lines (opens and shorts) to arise. As will be described later, where a single large-panel image sensor obtained from a single wafer is employed, the wiring for the image sensor can approach some 136 mm in length if laid end to end, and it is manufacturing defects in this wiring that has a great impact on the picture quality of the image sensor. The mirror-image arrangement of the present embodiment can improve the yield, and the resulting production cost reductions can be significant in the case of such large-panel image sensors as are described herein.

In the present invention according to the first embodiment, the vertical shift register, a horizontal shift register, a multiplexer, output amplifier, external terminal, and static electric protection. circuits (protection resistance and protection diode) connected to the external terminal which are conventionally disposed around the outer periphery of the conventional image sensor are disposed in the image sensor pixel region. Such an arrangement turns the entire surface of the image sensor into a pixel region, so when such an image sensor is compiled into tiles, there is no dead space along its periphery (that is, along the four sides of the image sensor). When a 3×3 span of tiles are aligned side-to-side there is essentially no gap between them, so such a circuit structure can form a seamless, large-panel image-sensing apparatus.

As described above, in a diagnostic radiographic apparatus, the size of the pixels can be as large as 50 μm to 200 μm a side (as described above, the present embodiment uses 160 μm a side), so sufficient aperture can be achieved even with the mounting of shift registers in the pixel region.

In the present embodiment, the shift registers are disposed within the pixel region, so X-rays passing through the scintillator hit the shift registers directly. Lead-containing FOP is used as an X-ray shielding member, but even so it is difficult to provide complete protection. The shift registers circuits are used to sequentially transmit pulse signals, so static shift registers are used as the shift registers.

Static-type shift registers are relatively unaffected by X-rays, so they can be used where they may be exposed directly by X-rays as in the present embodiment. Accordingly, by using static-type shift registers, an image-sensing apparatus little affected by X-ray-induced damage or error, that is, with improved reliability, can be achieved.

In addition, the present embodiment also uses CMOS-type image sensors for the image sensors, which consume little power and are well-suited to form large-panel image-sensing apparatuses.

Moreover, the inclusion of the multiplexer inside the image sensor speeds up the operation of the image sensor.

Moreover, signals are fed externally from the image sensors via the terminal 6, but because stray capacitance around the terminal 6 is large, an amplifier is provided in the stage previous to the terminal 6 so the signal transmission characteristics can be corrected.

Figure 4:
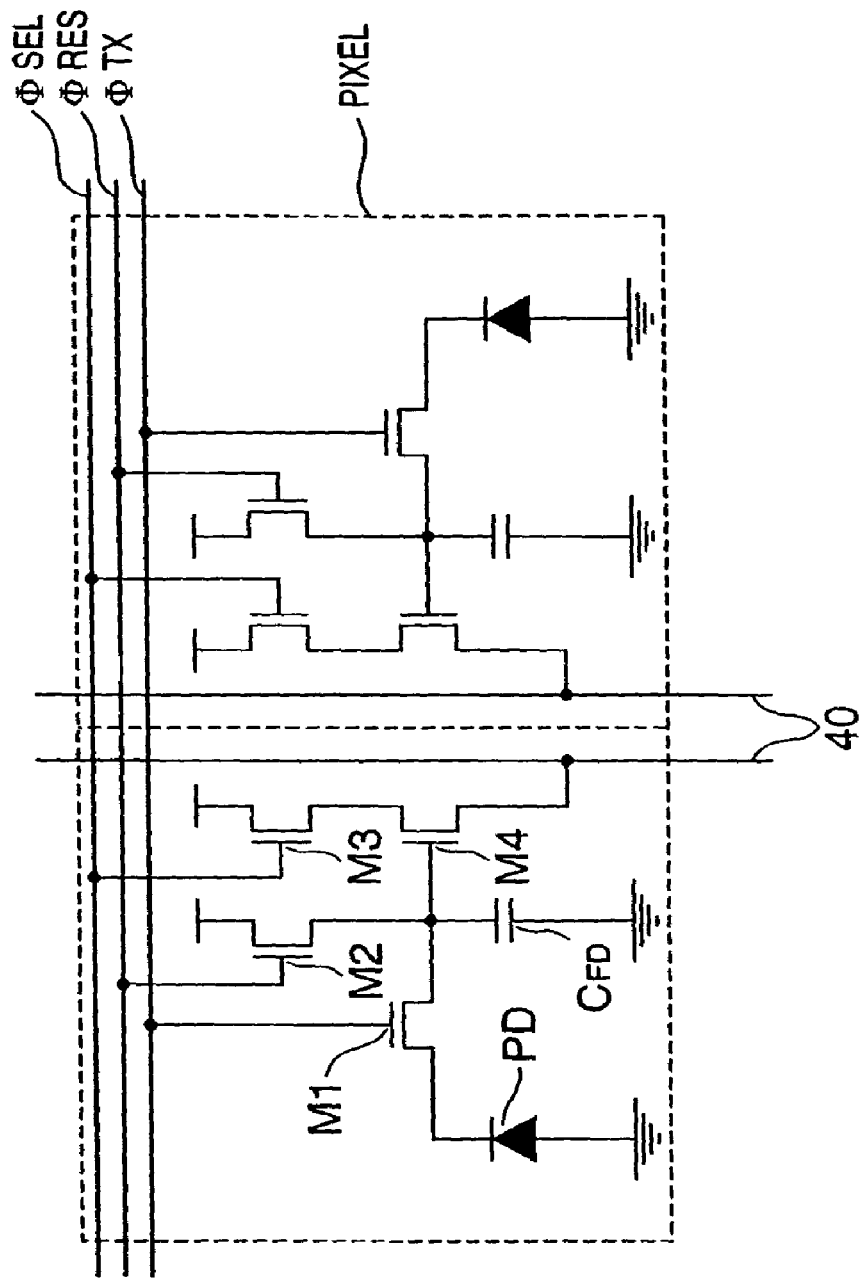
FIG. 4 is a diagram showing an equivalent circuit in a case in which two pixels are in a mirror-image arrangement.

FIG. 4 is a diagram showing an equivalent circuit in a case in which two pixels are in a mirror-image arrangement. In the first embodiment as described above, the elements that make up the pixel circuits 3 (the pixel-internal amplifiers, the pixel selection switches, the rest switches, the transmit switches) are also arranged symmetrically, so the equivalent circuit, too, expresses the same arrangement.

In FIG. 4, PD denotes a photodiode that performs photoelectric conversion and accumulates the electrical charge generated by that photoelectric conversion, $C_{FD}$ denotes the floating diffusion capacitor that stores an electrical charge, M1 denotes a transmission MOS transistor (transmission switch) that transmits the electrical charge generated by the photodiode to the floating diffusion CFD, M2 denotes a reset MOS transistor (reset switch) that discharges the electrical charge stored in the $C_{FD}$, M3 denotes a selection MOS transistor that selects the pixel, M4 denotes an amplifier MOS transistor (pixel amplifier) that functions as a source follower, and reference numeral 40 denotes a signal output line.

Figure 5:
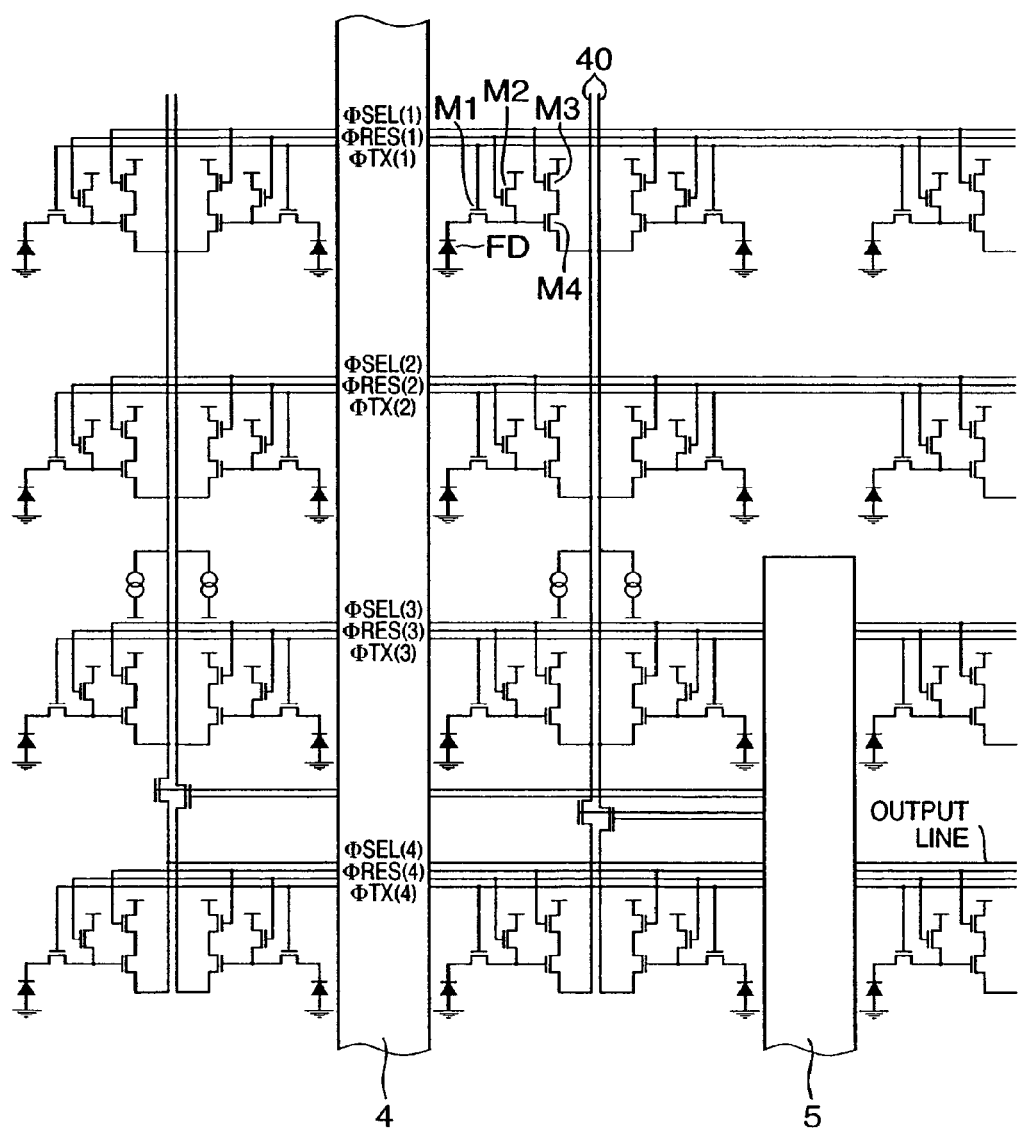
FIG. 5 is a schematic diagram showing a circuit structure of a circuit part having a 4×5 pixel arrangement.

FIG. 5 is a schematic diagram showing a circuit structure having a 4×5 pixel arrangement. A φTX(n) signal from the vertical block 4 that is a type of vertical scanning circuit is applied to the gate of the transmission switch M1, a φRES(n) signal from the vertical block 4 is applied to the gate of the reset switch M2, and a φSEL(n) signal from the vertical block 4 is applied to the gate of the selection switch M3. It should be noted that (n) denotes the line that applies the signals. In order to simplify the drawing, only the aforementioned three control lines are drawn. The noise signals and the photoelectric converted signals from the pixels are output through the signal wire 40 to a differential amplifier (not shown in the drawing) via a horizontal block 5 (including a horizontal shift register, a multiplexer, and so on).

Figure 6:
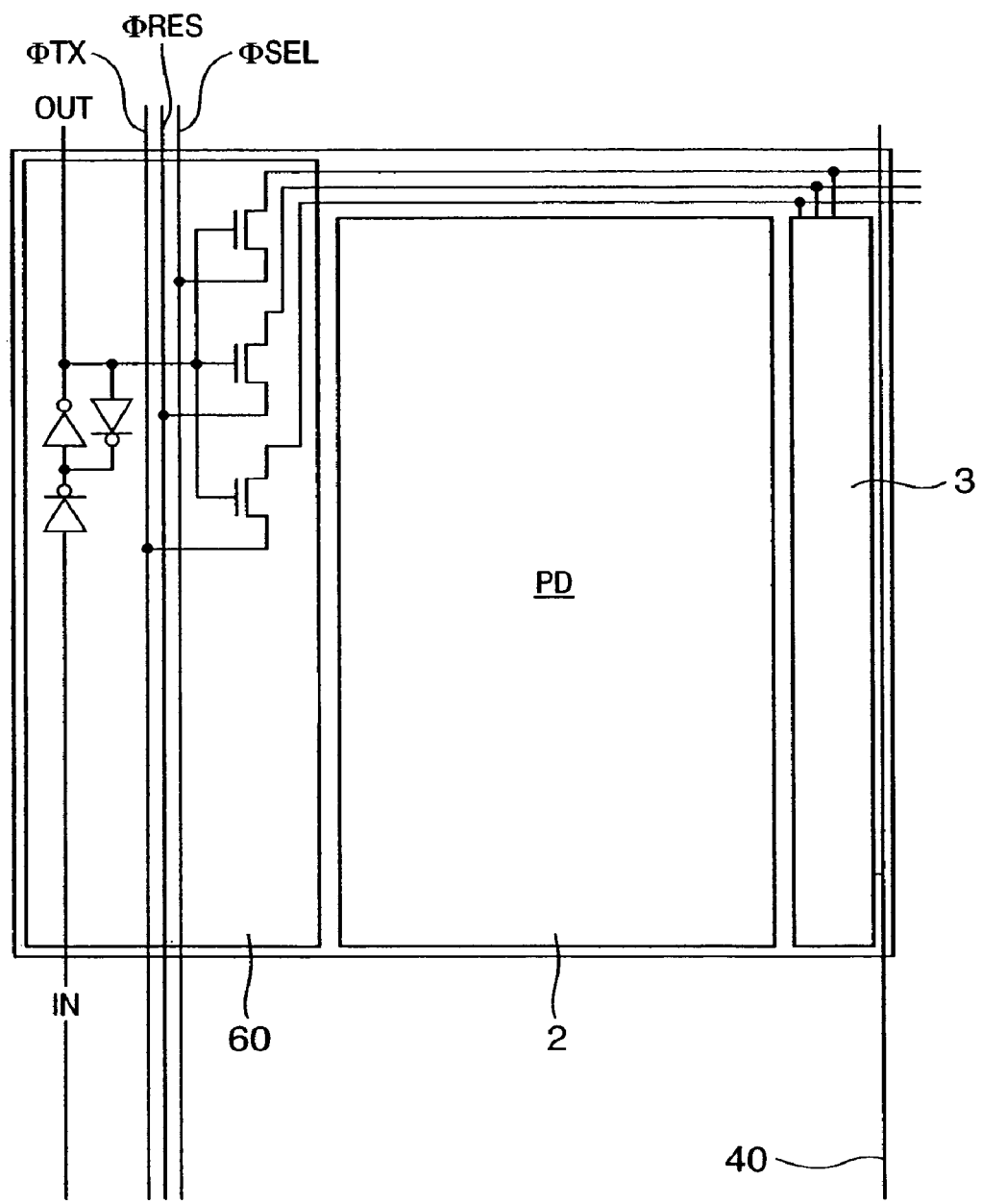
FIG. 6 is a diagram showing an arrangement of a photoelectric converter, a pixel circuit part and a vertical shift register in a single pixel according to a first embodiment of the present invention.

FIG. 6 is a diagram showing an arrangement of a unit block (unit for selecting and driving one line) of the vertical shift register of the vertical block 4 together with a photodiode of a photoelectric converter 2 and a pixel circuit 3 and in a unit area (single pixel) according to a first embodiment of the present invention. It should be noted that the equivalent circuit diagram for the single pixel (the photoelectric converter 2 and the pixel circuit 3) is depicted in FIG. 4.

For simplicity of explanation, the surface area of the photodiode PD (photoelectric converter 2) and of the pixel circuit 3 are not shown at actual size but have been schematized.

Here, a simple circuit, composed of the static-type shift registers and the transmission gates, for producing the transmission signal φTX, the reset signal φRES and the selection signal φSEL is shown as the vertical shift register. This simple circuit is driven by a clock signal from a clock signal line (not shown in the diagram). The circuit structure of the shift registers is not limited to this embodiment but may be any desired circuit structure depending on how it is driven, (addition or intervallic read-out, for example).

By disposing the shift register functional blocks between the pixels as shown in the first embodiment described above, the shift registers can be provided within the effective pixels region, turning the entire surface of an image sensor into pixel region.

As can be appreciated by those of ordinary skill in the art, an n-to-$2^n$ decoder may be used instead of the shift registers as a scanning circuit. By connecting to the decoder input the output of a counter that sequentially increments, it becomes possible to sequentially scan like the shift registers. By inputting the address of the region one wishes to acquire an image of to the decoder input, an image can be obtained of any desired region by random scanning.

Figure 7:
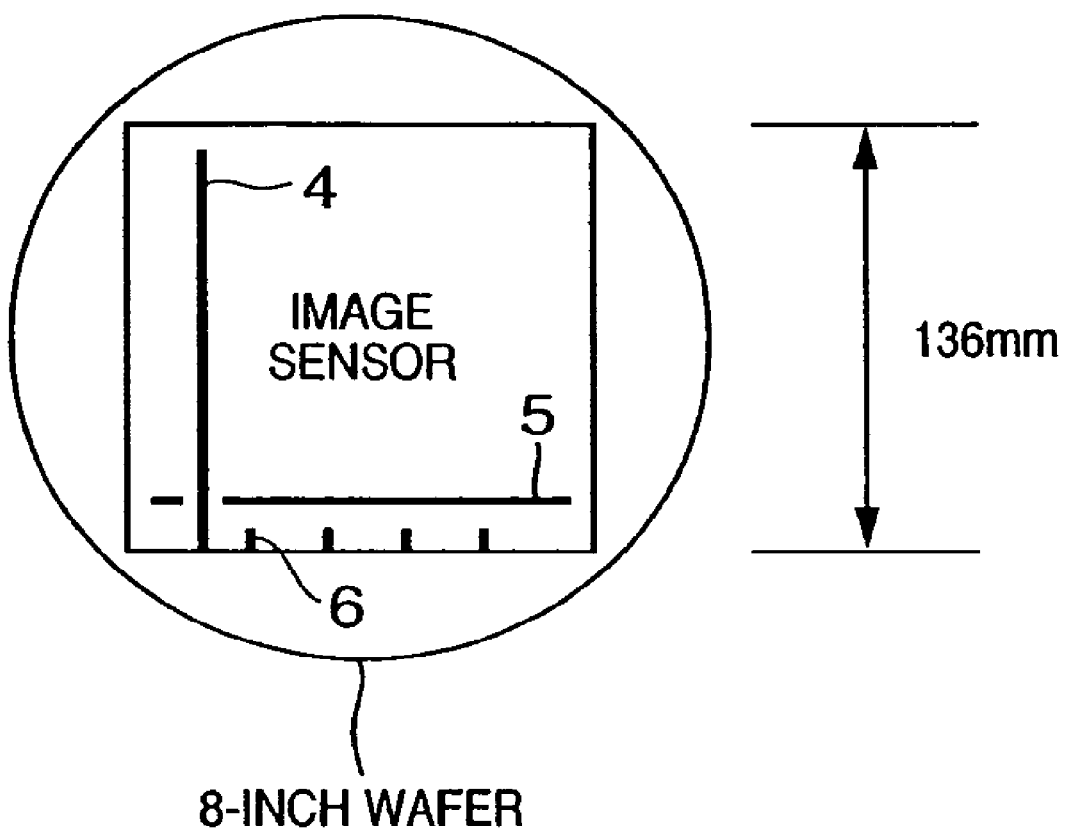
FIG. 7 is a diagram showing a plan view of a wafer and an image sensor created therefrom according to a first embodiment of the present invention.

FIG. 7 is a diagram showing a plan view of a wafer and an image sensor created therefrom according to a first embodiment of the present invention. The wafer shown is the current mainstream 8-inch size. Using a CMOS process, a single 136 mm-square CMOS image sensor is produced.

Figure 8:
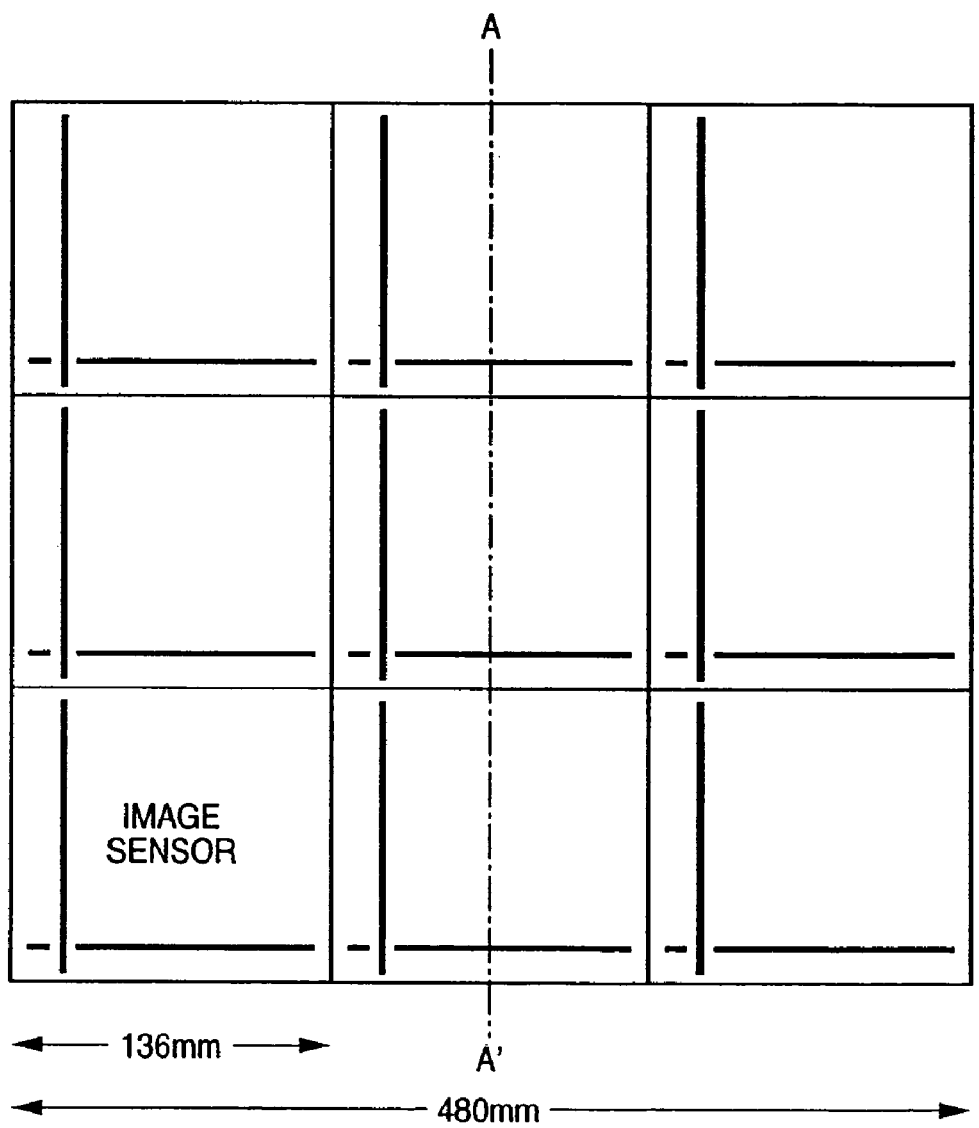
FIG. 8 is a diagram showing a plan view of an array of image sensors and an array of scanning circuits in an image-sensing apparatus according to a first embodiment of the present invention.

FIG. 8 is a diagram showing a plan view of an array of image sensors and an array of scanning circuits in an image-sensing apparatus according to a first embodiment of the present invention. More specifically, FIG. 8 shows the image sensor portion of a large-area radiographic apparatus created by combining nine 136 mm-square tiles of image sensors having pixel structures into a 408 mm-square large-area radiographic apparatus shown here, in which the image sensor tiles are combined so that pitches at the borders between the tiles are equal to the pitch within each tile. (For ease of depiction, the FOP and the scintillator are not shown in the diagram.)

Figure 9:
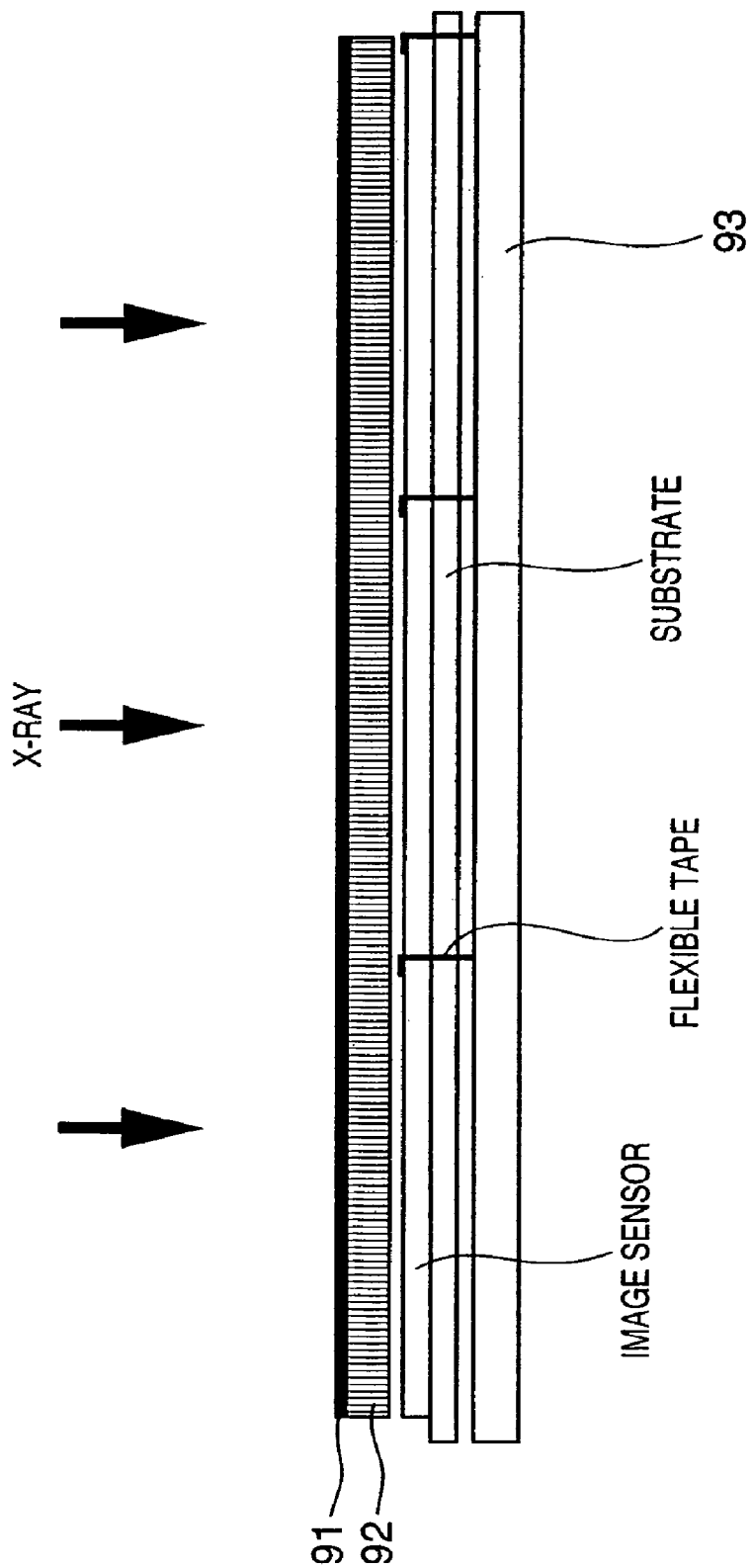
FIG. 9 is a cross-sectional view of the image-sensing apparatus according to a first embodiment of present invention, along a line A-A' shown in FIG. 8.

FIG. 9 is a cross-sectional view of the image-sensing apparatus according to a first embodiment of present invention, along a line A-A' shown in FIG. 8. A scintillator 91 composed of $Gd_2O_2S$ and CsI using europium and terbium as inert elements is disposed atop a FOP 92. Although in the present embodiment a leaded FOP is used as a non-magnification optical transmission system, a non-magnification lens array, such as a two-dimensional selfoc lens array, used in combination with leaded glass may be used instead. The light utilization rate of a non-magnification lens array is not as good as that of an FOP, but it is inexpensive and its use can lower the production cost of the image-sensing apparatus overall. Alternatively, the image sensors themselves can be given an X-ray-resistant device structure, thus eliminating the need to use a non-magnification optical transmission system that shields X-rays and allowing the scintillator 91 to be disposed directly on the image sensor. In this case, the scintillator 91 and the image sensors are joined together using an optically transparent adhesive agent, which may be resin. If the transparent adhesive agent is thin enough, it can be interpreted as the non-magnification optical transmission system. The X-rays are then incident on the scintillator 91 and are converted into visible light. The visible light is then sensed by the image sensors. It is preferable to select the scintillator 91 whose emission light wavelengths are suitable for the sensitivity of the image sensors. An external processing board 93 supplies power and a clock to the image sensors, and additionally, has a circuit that acquires and processes signals from the image sensors. The flexible tape provides an electrical connection between the image sensors and the external processing board 93. TAB (Tape—Automated Bonding) may be used as the flexible tape.

The nine tiles of image sensors are essentially glued together without gaps between the image sensors. Here, the term "essentially without gaps" means that the image formed by the nine image sensors has no missing pixels. The image sensor clock, the power input and the output of the signals from the image sensors are fed through the flexible tape connected to the terminal 6 provided on the edge portion of the image sensor and to the external processing board 93 provided on the rear of the image sensors. The thickness of the flexible tape is from 20 μm to 30 μm and sufficiently thin for the widths involved so that no defects appear in the image even when passing through gaps between the image sensors.

As described above, according to the first embodiment, by repeatedly arranging in a predetermined direction two pixels composed of one pixel arranged in the sequence of a predetermined empty region, a photoelectric converter and a pixel circuit and another pixel arranged in the sequence of pixel circuit, photoelectric converter and predetermined empty region, and by providing a scanning circuit such as a vertical block 4 or a horizontal block 5 in a desired empty region so as to form a large-panel image sensor from a combination of a plurality of smaller image sensor panels, deterioration in picture quality at the junction of the image sensor panels as well as deterioration in picture quality due to unevenness in the pitch between respective photoreceptors can be prevented.

In addition, as can be appreciated by those of ordinary skill in the art, the first embodiment is not limited to an instance in which two pixels having the structure described above are repeated horizontally. Rather, the first embodiment also includes an instance in which, of the plurality of pixels arranged horizontally, the leftmost pixel accommodates, in rotating repetitive order, a predetermined empty region, a photoelectric converter, and a pixel circuit, and the rightmost pixel accommodates, in rotating repetitive order, a pixel circuit, a photoelectric converter, and a predetermined empty region (the order of arrangement in both cases being from left to right), and further, a pixel accommodating a pixel circuit, a photoelectric converter, and a predetermined empty region (in that order) and a pixel accommodating a predetermined empty region, a photoelectric converter and a pixel circuit, in that order, are positioned adjacent to each other in order for a scanning circuit to be provided at least one location, such that the remaining pixels may be of any arbitrary compositional sequence or order. An example of such a situation is illustrated in FIG. 13.

Figure 13:
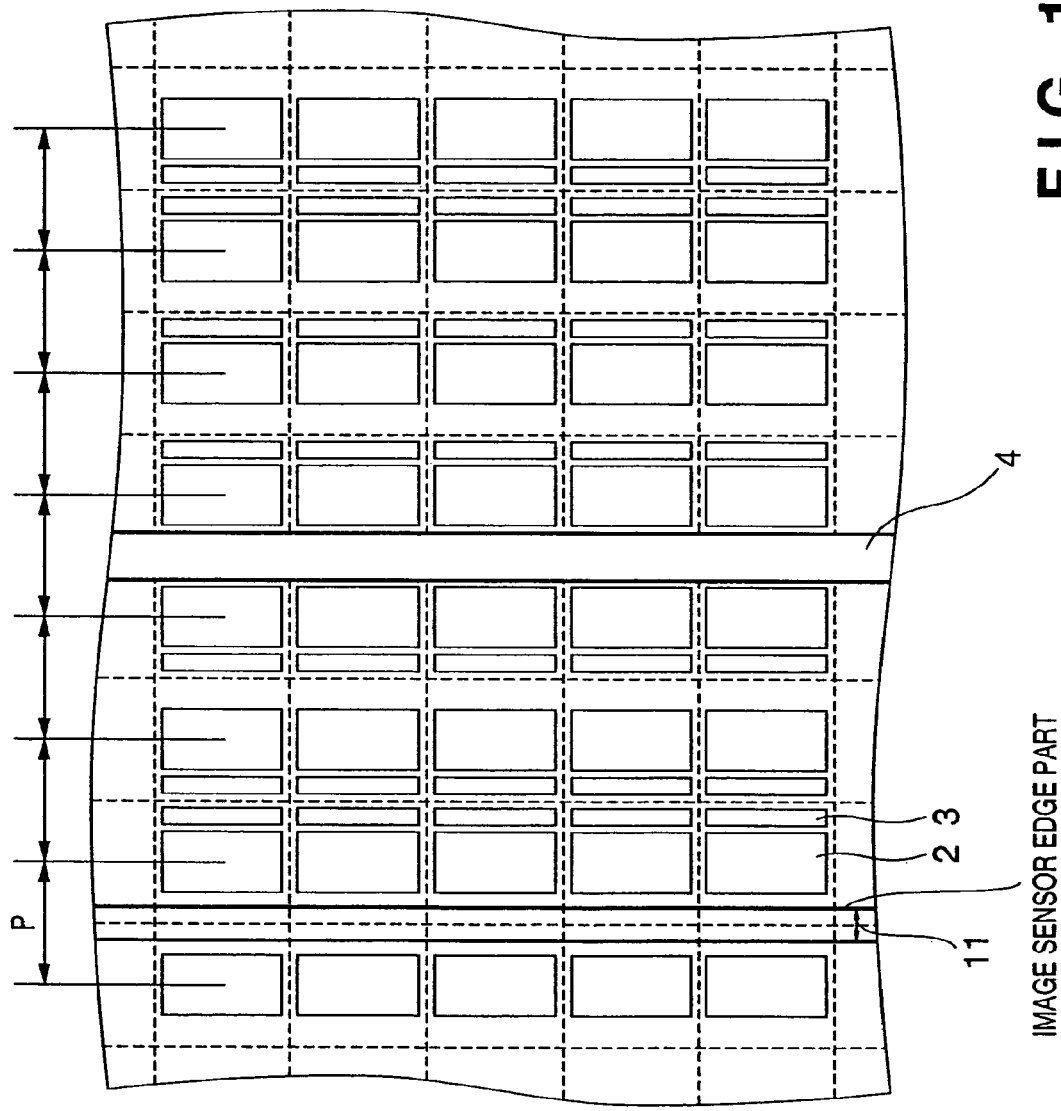
FIG. 13 shows a variation of the image-sensing apparatus according to a first embodiment, in which a pixel arrangement is varied horizontally in order to accommodate a scanning circuit.

FIG. 13 shows a variation of the image-sensing apparatus according to a first embodiment, in which a pixel arrangement is varied horizontally in order to accommodate a scanning circuit. In FIG. 13, reference numeral 1 denotes an image sensor edge part, reference numeral 2 denotes a photoelectric converter, reference numeral 3 denotes the pixel circuit 3 and reference numeral 4 denotes the vertical scanning circuit.

The above arrangement can also prevent deterioration in picture quality at the junction of the image sensor panels as well as deterioration in picture quality due to unevenness in the pitch between respective photoreceptors, when a large-panel image sensor is formed from a combination of a plurality of smaller image sensor panels.

Second Embodiment

A description is now given of a second embodiment of the present invention, with reference to the accompanying drawings.

Figure 10:
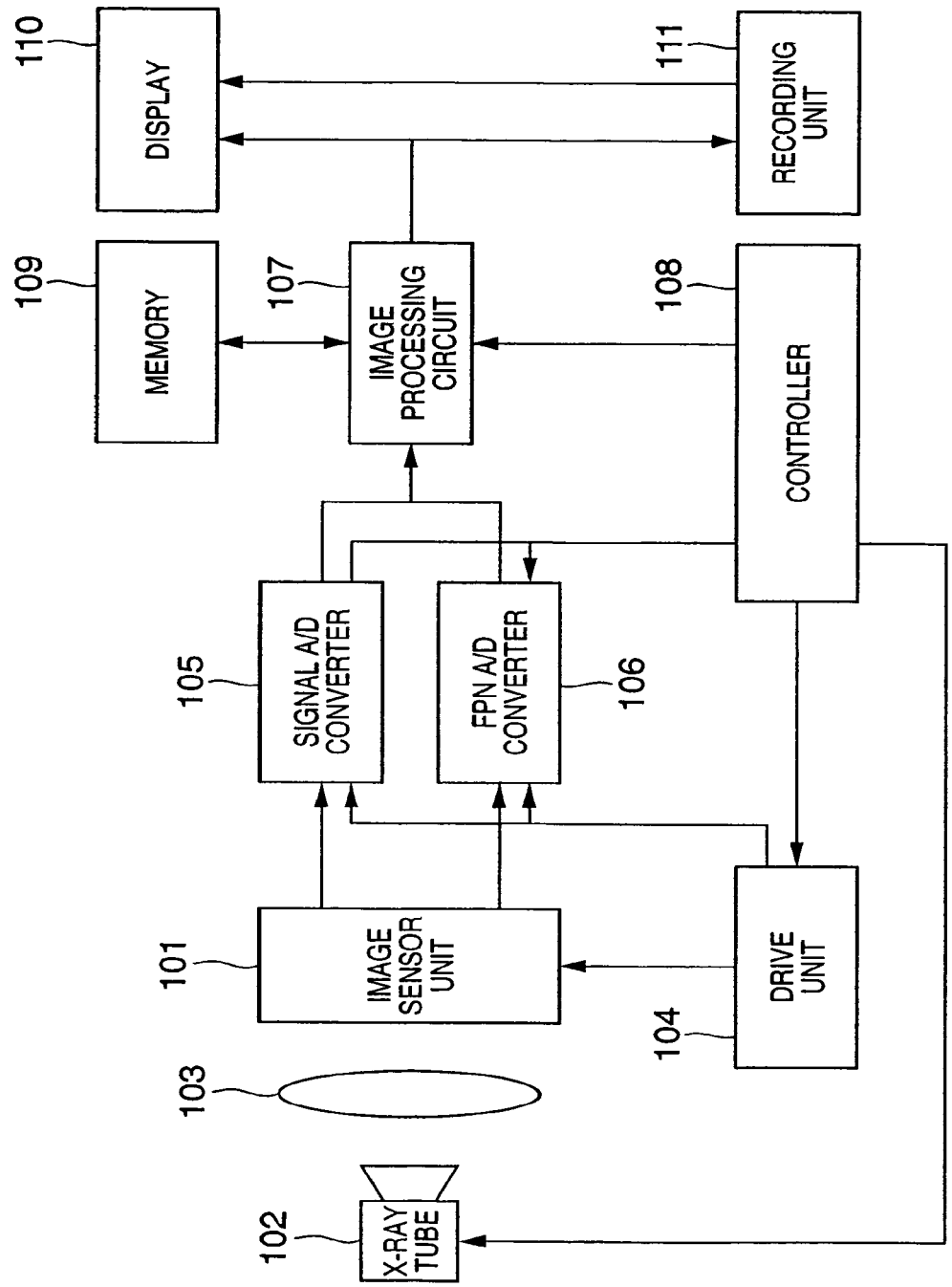
FIG. 10 is a block diagram of a radiographic apparatus according to a second embodiment of the present invention.

FIG. 10 is a block diagram of a radiographic apparatus according to a second embodiment of the present invention.

As shown in the diagram, an image of a subject 103 (in this case, a person's chest) is acquired by irradiation from an X-ray source 102. The image sensing unit 101 is composed of the image-sensing apparatus of the first embodiment, a scintillator that converts radiation to visible light, an X-ray shielding member and peripheral drive circuitry.

A 4×8 signal (that is, a signal output from a 9×2 output line from nine image sensors) from an image sensor unit 101 is converted from analog to digital by a signal A/D converter 105 and an FPN A/D converter 106. An image sensor drive unit 104 is mounted adjacent to the image sensor unit 101.

The nine frames of A/D converted image signals undergo combining operation and defective noise correction by an image processing circuit 107 and a memory 109. The processed signal is then either recorded to a recording unit 111 or displayed at a display unit 110 (that is, a monitor), and printed as necessary. The aforementioned circuitry and apparatuses are controlled entirely by a controller 108. The controller 108 also controls the triggering of the X-ray source 102 and the image sensors.

Signals temporarily stored in the memory 109 then undergo image processing (.gamma.-processing and interpolation, etc.) so as to compose a single image from the signals from the image sensors. The processed output is then stored to a large-scale image memory, and the memory output is displayed at a display unit 109 such as a monitor. When image acquisition is complete the process terminates. The data taken into the image-sensing apparatus is transmitted to a personal computer or the like, where the data is further processed, typically using a software application program, for diagnosis of the subject image.

The image processing described above can be performed using a program stored in a personal computer or the like. Similarly, the present invention includes a CD ROM or other such storage medium on which such program is recorded. By reading out the program recorded on such a CD ROM, the image processing method according to the above-described second embodiment of the present invention can be executed.

Third Embodiment

A description is now given of a third embodiment of the present invention, with reference to the accompanying drawings.

Figure 11:
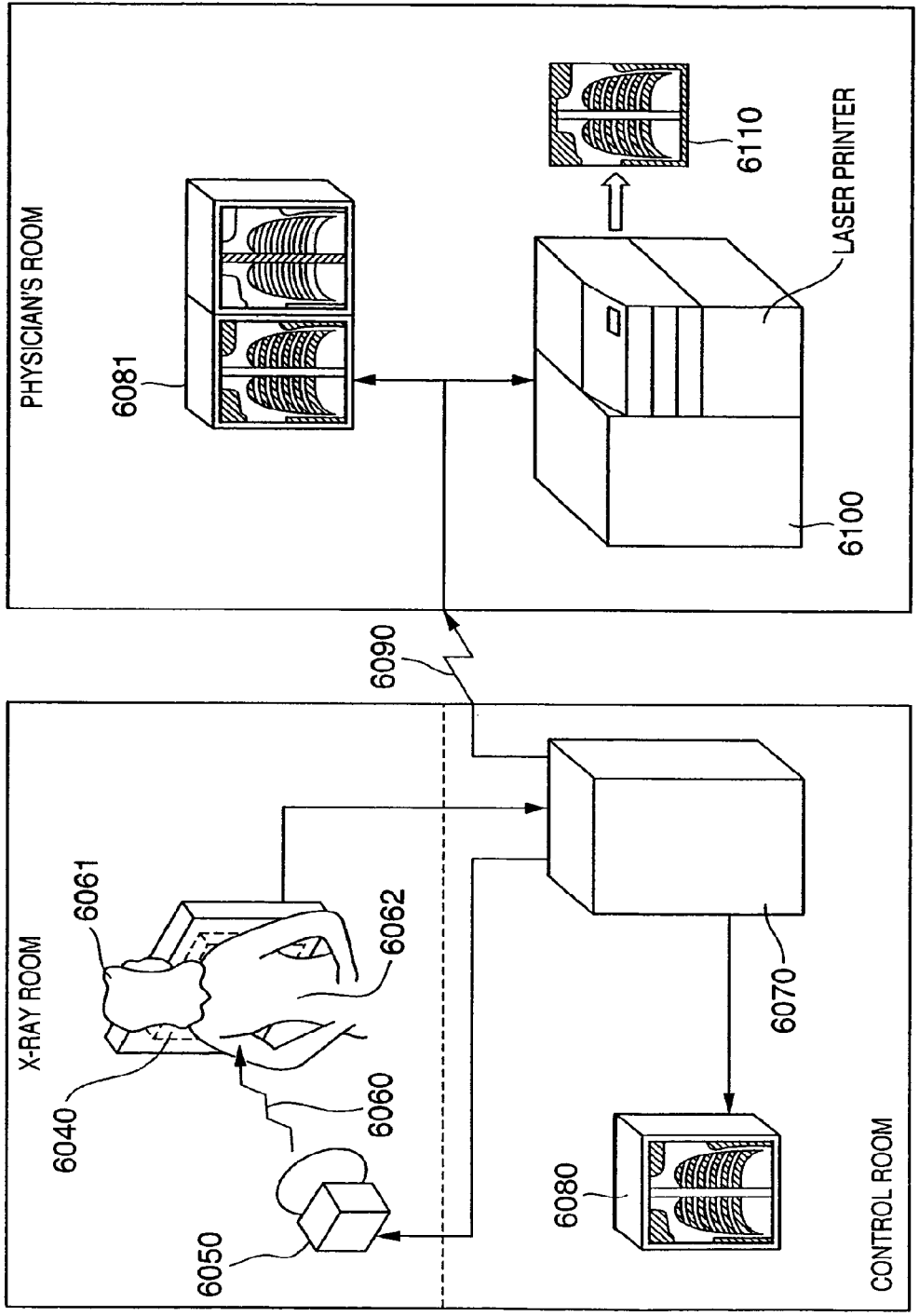
FIG. 11 is a schematic diagram of a radiographic apparatus adapted to a radiographic diagnostic system according to a third embodiment of the present invention.
Figure 12:
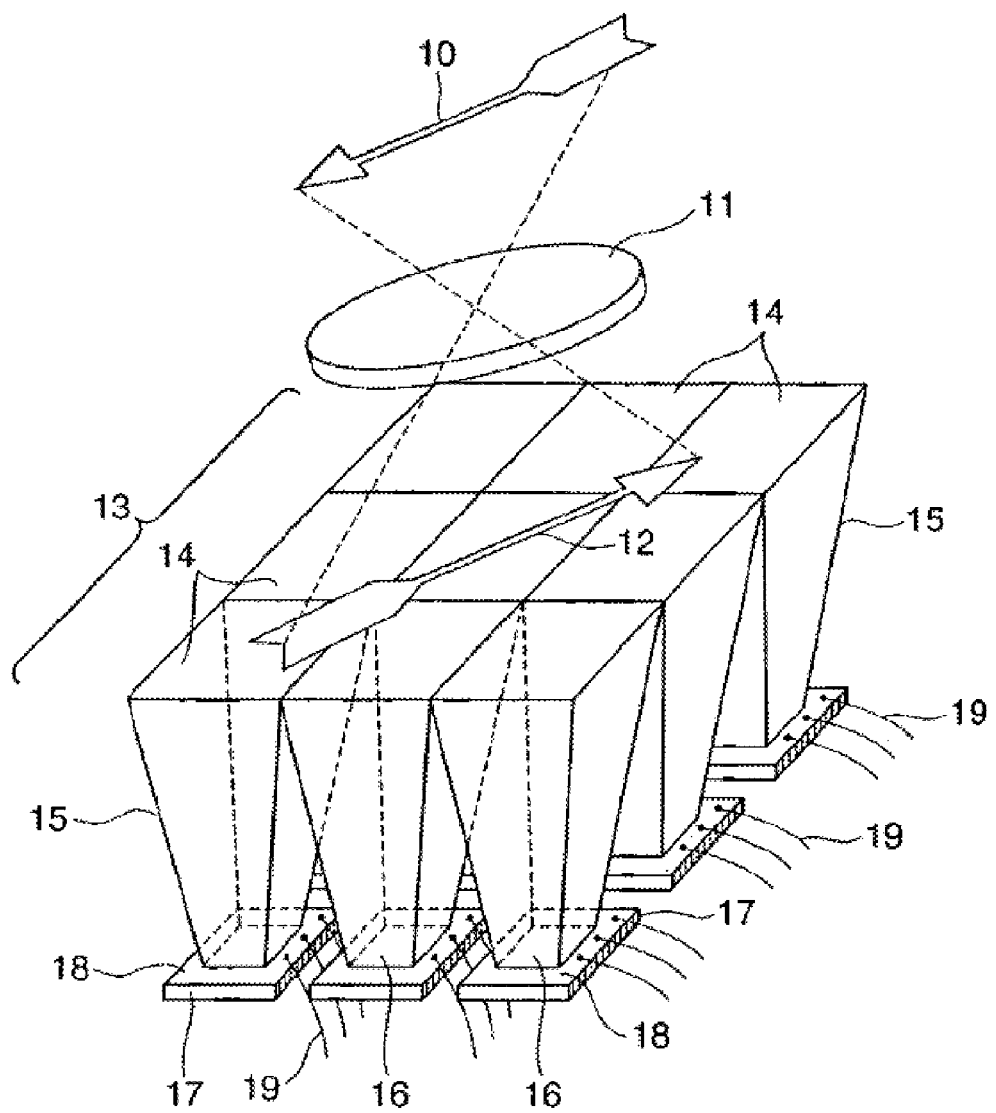
FIG. 12 is a diagram showing an example of a conventional image-sensing apparatus.

FIG. 11 is a schematic diagram of a radiographic apparatus adapted to a radiographic diagnostic system according to a third embodiment of the present invention.

As shown in the diagram, X-rays 6060 produced by an X-ray tube 6050 pass through the chest area 6062 of a patient or test subject 6061 and into a radiographic apparatus 6040 comprising a scintillator, an FOP, image sensors, as those shown in FIG. 9, and an external processing board (not shown). The scintillator generates light in response to the influx of the X-ray radiation 6060 and the image sensors convert the light to electrical signals to obtain electrical information. The information is then digitalized and processed by an image processor 6070 for viewing on a first display 6080 in a control room.

In addition, the information described above can be transmitted to a remote location by a transmission means. The transmission means may be an ordinary telephone line 6090. The remote location may be a physician's office, and the information so transmitted can be displayed on a second display 6081 in the office or stored on a storage medium. The storage medium may be an optical disk. Such an arrangement enables a physician at a remote location to view the radiographic image and provide a diagnosis. Similarly, the information can be recorded on film 6110 by a film processor.

As can be appreciated by those of ordinary skill in the art, the present invention is not limited to the above-described embodiments, and various changes and modifications can be made within the spirit and scope of the present invention. Therefore, in order to apprise the public of the scope of the present invention, the following claims are made.

What is claimed is:

1. An image-sensing apparatus comprising a plurality of image sensors, each of the image sensors comprising:
   a plurality of pixels, each pixel including a photoelectric converter and a pixel circuit for processing signals from the photoelectric converter and outputting processed signals to an output line, the plurality of pixels having at least one position at which a first pixel and a second pixel are disposed adjacent to each other, the photoelectric converter of the first pixel and the photoelectric converter of the second pixel are disposed adjacent to each other and between the pixel circuit of the first pixel and the pixel circuit of the second pixel; and
   a scan control block disposed between the first pixel and the second pixel,
   wherein the scan control block includes a shift register or a decoder as a scanning circuit and is disposed between the photoelectric converter of the first pixel and the photoelectric converter of the second pixel.

2. The image-sensing apparatus according to claim 1, wherein the pixel circuit of each pixel comprises an amplifier unit adapted to amplify a signal from the photoelectric converter and a reset unit adapted to reset an input part of the amplifier unit.

3. The image-sensing apparatus according to claim 1, wherein the first pixel and the second pixel are arranged so that the photoelectric converters are arranged at the same pitch and have the same area.

4. The image-sensing apparatus according to claim 1, further comprising a scintillator disposed on a proximal surface of the plurality of image sensors.

5. The image-sensing apparatus according to claim 1, further comprising a third pixel including a pixel circuit disposed adjacent to the pixel circuit of the second pixel and a photoelectric converter disposed adjacent to the pixel circuit of the third pixel, and a fourth pixel including photoelectric converter disposed adjacent to the photoelectric converter of the third pixel and a pixel circuit disposed adjacent to the photoelectric converter of the fourth pixel, wherein the first to fourth pixels are arranged so that the photoelectric converters are arranged at the same pitch and have the same area.

6. An image-sensing apparatus comprising a plurality of image sensors, each of the image sensors comprising:
   a plurality of pixels, each pixel including a photoelectric converter and a pixel circuit for processing signals from the photoelectric converter and outputting processed signals to an output line, the plurality of pixels having at least one position at which a first pixel and a second pixel are disposed adjacent to each other, the photoelectric converter of the first pixel and the photoelectric converter of the second pixel are disposed adjacent to each other and between the pixel circuit of the first pixel and the pixel circuit of the second pixel; and
   a processing circuit adapted to process signals from the plurality of pixels, disposed between the first pixel and the second pixel,
   wherein the processing circuit includes a scanning circuit and a multiplexer, and the scanning circuit and the multiplexer are disposed between the photoelectric converter of the first pixel and the photoelectric converter of the second pixel.

7. The image-sensing apparatus according to claim 6, wherein the pixel circuit of each pixel comprises an amplifier unit adapted to amplify a signal from the photoelectric converter and a reset unit adapted to reset an input part of the amplifier unit.

8. The image-sensing apparatus according to claim 6, wherein the first pixel and the second pixel are arranged so that the photoelectric converters are arranged at the same pitch and have the same area.

9. The image-sensing apparatus according to claim 6, further comprising a scintillator disposed on a proximal surface of the plurality of image sensors.

10. The image-sensing apparatus according to claim 6, further comprising a third pixel including a pixel circuit disposed adjacent to the pixel circuit of the second pixel and a photoelectric converter disposed adjacent to the pixel circuit of the third pixel, and a fourth pixel including photoelectric converter disposed adjacent to the photoelectric converter of the third pixel and a pixel circuit disposed adjacent to the photoelectric converter of the fourth pixel, wherein the first to fourth pixels are arranged so that the photoelectric converters are arranged at the same pitch and have the same area.

11. An image-sensing apparatus comprising a plurality of image sensors, each of the image sensors comprising:
- a plurality of pixels, each pixel including a photoelectric converter and a pixel circuit for processing signals from the photoelectric converter and outputting processed signals to an output line, the plurality of pixels having at least one position at which a first pixel and a second pixel are disposed adjacent to each other, the photoelectric converter of the first pixel and the photoelectric converter of the second pixel are disposed adjacent to each other and between the pixel circuit of the first pixel and the pixel circuit of the second pixel; and
- a logic circuit disposed between the photoelectric converter of the first pixel and the photoelectric converter of the second pixel.

12. The image-sensing apparatus according to claim 11, wherein the pixel circuit of each pixel comprises an amplifier unit adapted to amplify a signal from the photoelectric converter and a reset unit adapted to reset an input part of the amplifier unit.

13. The image-sensing apparatus according to claim 11, wherein the first pixel and the second pixel are arranged so that the photoelectric converters are arranged at the same pitch and have the same area.

14. The image-sensing apparatus according to claim 11, further comprising a scintillator disposed on a proximal surface of the plurality of image sensors.

15. The image-sensing apparatus according to claim 11, further comprising a third pixel including a pixel circuit disposed adjacent to the pixel circuit of the second pixel and a photoelectric converter disposed adjacent to the pixel circuit of the third pixel, and a fourth pixel including photoelectric converter disposed adjacent to the photoelectric converter of the third pixel and a pixel circuit disposed adjacent to the photoelectric converter of the fourth pixel, wherein the first to fourth pixels are arranged so that the photoelectric converters are arranged at the same pitch and have the same area.

* * * * *